(12) United States Patent
Shen (10) Patent No.: US 7,964,940 B2
(45) Date of Patent: Jun. 21, 2011

(54) CHIP PACKAGE WITH ASYMMETRIC MOLDING

(75) Inventor: Geng-Shin Shen, Tainan County (TW)

(73) Assignees: ChipMOS Technologies, Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 193 days.

(21) Appl. No.: 12/271,550

(22) Filed: Nov. 14, 2008

(65) Prior Publication Data

US 2009/0065913 A1 Mar. 12, 2009

Related U.S. Application Data

(62) Division of application No. 11/351,651, filed on Feb. 10, 2006, now Pat. No. 7,504,714.

(30) Foreign Application Priority Data

Jul. 27, 2005 (TW) ................................. 94125376 A (51) Int. Cl.
 *H01L 23/495* (2006.01)
(52) U.S. Cl. ......... 257/666; 257/670; 257/676; 438/123
(58) Field of Classification Search .................. 257/666, 257/670, 676, 691, 696, E23.043, E23.047; 438/123
See application file for complete search history.

(56) References Cited

U.S. PATENT DOCUMENTS

| 6,046,504 A | 4/2000 | Kimura | 257/775 |
| 6,122,822 A * | 9/2000 | Liao | 29/827 |
| 6,414,379 B1 * | 7/2002 | Chang et al. | 257/666 |
| 7,576,416 B2 * | 8/2009 | Tu et al. | 257/669 |

FOREIGN PATENT DOCUMENTS

CN 1355562 A 6/2002

OTHER PUBLICATIONS

Chinese First Examination Report of China Application No. 2005100901070, dated on Oct. 12, 2007.

* cited by examiner

Primary Examiner — Theresa T Doan
(74) Attorney, Agent, or Firm — J.C. Patents (57) ABSTRACT

A chip package with asymmetric molding including a lead frame, a chip, an adhesive layer, bonding wires and an encapsulant, is provided. The lead frame includes a frame body and at least a turbulent plate. The frame body has inner lead portions and outer lead portions. The turbulent plate is bended upwards to form a bulge portion and the first end of the turbulent plate is connected to the frame body. The chip is fixed under the inner lead portions and the turbulent plate is located at one side of the chip. The adhesive layer is disposed between the chip and the inner lead portions, and the bonding wires are electrically connected between the chip and the corresponding inner lead portions, respectively. The encapsulant encapsulates at least the chip, the bonding wires, the inner lead portions, the adhesive layer and the turbulent plate.

9 Claims, 7 Drawing Sheets

CHIP PACKAGE WITH ASYMMETRIC MOLDING

CROSS-REFERENCE TO RELATED APPLICATION

This application is a divisional application of U.S. application Ser. No. 11/351,651, filed on Feb. 10, 2006, now pending. The parent application claims the priority benefit of Taiwan application serial no. 94125376, filed on Jul. 27, 2005. The entirety of the above-mentioned patent applications is hereby incorporated by reference herein and made a part of this specification.

BACKGROUND OF THE INVENTION

1. Field of Invention

The present invention relates to a chip package with asymmetric molding, and particularly to a chip package with a lead frame.

2. Description of the Related Art

For a dynamic random access memory (DRAM), the packaging method can be categorized into small outline J-lead (SOJ) package and thin small outline package (TSOP), both of which has the advantage of fast transmission rate, good heat dispersion and compact size. In terms of lead frames, the SOJ package and the TSOP can further be classified into lead on chip (LOC) package, U.S. Pat. No. 4,862,245, and chip on lead (COL) package, U.S. Pat. No. 4,989,068.

Figure 1A:
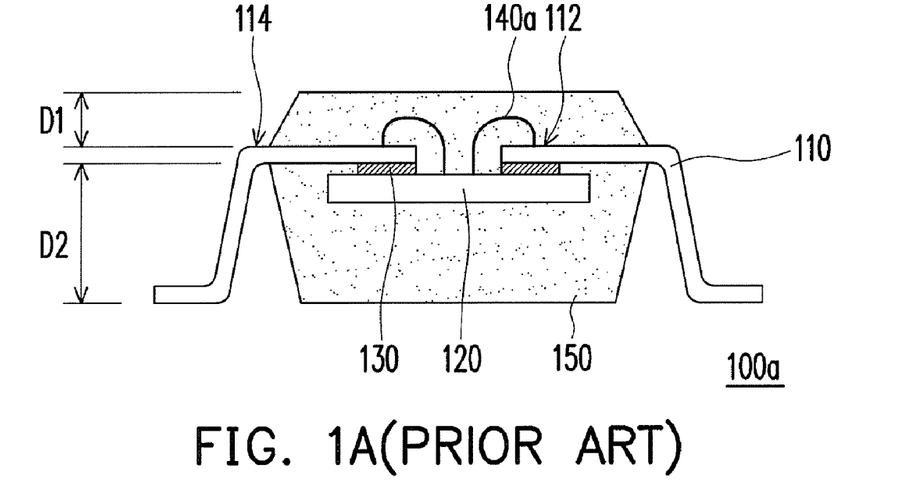
FIG. 1A is a schematic cross-sectional view of a conventional thin small outline package (TSOP) with lead on chip (LOC) configuration.

FIG. 1A is a schematic cross-sectional view of a conventional thin small outline package TSOP having lead on chip (LOC) configuration. Referring to FIG. 1A, a conventional thin small outline package (TSOP) 100a includes a lead frame 110, a chip 120, an adhesive layer 130, first bonding wires 140a and an encapsulant 150, wherein the lead frame 110 has inner lead portions 112 and outer lead portions 114. The chip 120 is fixed on the Lower surfaces of inner lead portions through the adhesive layer 130 between the chip 120 and the inner lead portion 112. The first bonding wires 140a are electrically connected between the chip 120 and the corresponding inner lead portions 112, respectively. The encapsulant 150 is used for encapsulating the inner lead portions 112, the chip 120, the adhesive layer 130 and the first bonding wires 140a.

Note that the thickness D1 of the encapsulant 150 over the outer lead portions 114 is 1:3 in proportion to the thickness D2 of the encapsulant 150 under the outer lead portions 114. Therefore, as the encapsulant 150 condenses and shrinks, the TSOP 100a can be damage due to the warpage.

Figure 1B:
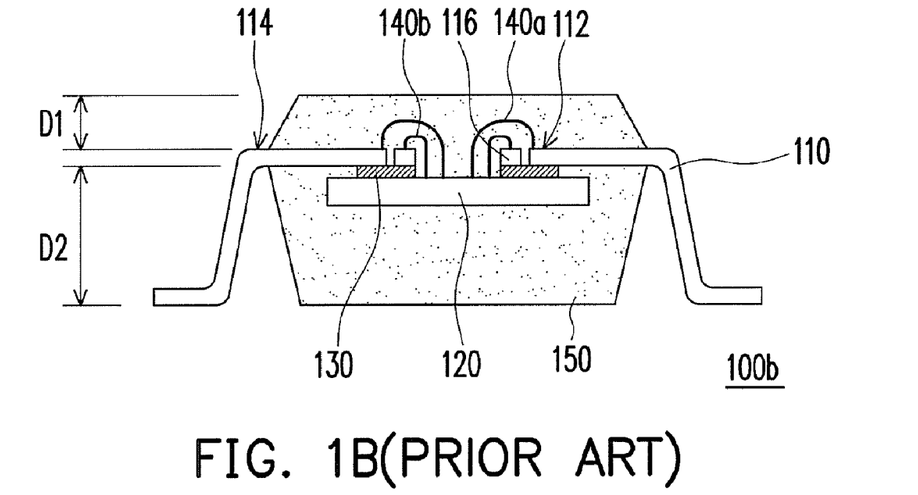
FIG. 1B is a schematic cross-sectional view of another conventional thin small outline package (TSOP) with lead on chip (LOC) configuration.

FIG. 1B is a schematic cross-sectional view of another conventional thin small outline package (TSOP) with lead on chip (LOC) configuration. FIG. 1B is similar to FIG. 1A. The difference in FIG. 1B is the conventional TSOP 100b herein further includes second bonding wires 140b and the lead frame 110 further includes bus bars 116, which are adjacent to the inner lead portions 112. In addition, the second bonding wires 140b are electrically connected between the bus bars 116 and the chip 120. However, the conventional TSOP 100b still has the above-described problems.

SUMMARY OF THE INVENTION

Based on the above, an object of the present invention is to provide a chip package with asymmetric molding having better reliability.

Another object of the present invention is to provide a chip package with asymmetric molding, for reducing the warpage caused when the encapsulant condenses and shrinks.

Based on the above and other objects, the present invention provides a chip package with asymmetric molding, which includes a lead frame, a chip, an adhesive layer, first bonding wires and an encapsulant, wherein the lead frame includes a frame body and at least a turbulent plate. The frame body has inner lead portions and outer lead portions. The turbulent plate bends upwards to form a bulge portion and has a first end and a second end, wherein the first end is connected to the frame body. The chip is fixed on the lower surfaces of inner lead portions through the adhesive layer between the chip and the inner lead portions. The turbulent plate is located at one side of the chip. The first bonding wires are electrically connected between the chip and the corresponding inner lead portions, respectively. The encapsulant is used for encapsulating at least the chip, the first bonding wires, the inner lead portions, the adhesive layer and the turbulent plate. Wherein, the thickness of the encapsulant part under the outer lead portions and the thickness of the encapsulant part over the outer lead portions are not equal.

According to the embodiment of the present invention, the second end of the turbulent plate can be bended to be flat.

According to the embodiment of the present invention, the turbulent plate is bended upwards to form a bulge portion first, then bended downwards and the second end thereof is higher than the inner lead portions.

According to the embodiment of the present invention, the turbulent plate is bended upwards to form a bulge portion first, then bended downwards and the second end of the turbulent plate and the inner lead portions are coplanar.

According to the embodiment of the present invention, the turbulent plate is bended upwards to form a bulge portion first, then bended downwards and the second end of the turbulent plate is lower than the inner lead portions.

According to the embodiment of the present invention, the lead frame further includes at least a supporting bar connected between the second end of the turbulent plate and the frame body. Alternatively, the supporting bar can be connected between the frame body and the turbulent plate.

According to the embodiment of the present invention, the inner lead portions can be designed as down-set.

According to the embodiment of the present invention, the die pad can be lower than the inner lead portions.

According to the embodiment of the present invention, the frame body can further include bus bars, which are adjacent to the inner lead portions. In addition, the chip package with asymmetric molding further includes second bonding wires electrically connected between the chip and the corresponded bus bars, respectively. The encapsulant further encapsulates the second bonding wires and the bus bars.

According to the embodiment of the present invention, the turbulent plate can have openings.

According to the embodiment of the present invention, the thickness of the encapsulant part under the bulge portion of the turbulent plate and the thickness of the encapsulant part over the bulge portion of the turbulent plate are not equal.

Based on the above described, the present invention adds a novel turbulent bended upwards to prevent the warpage caused when the encapsulant condenses and shrinks, thus enhancing the reliability of the chip package.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 2A:
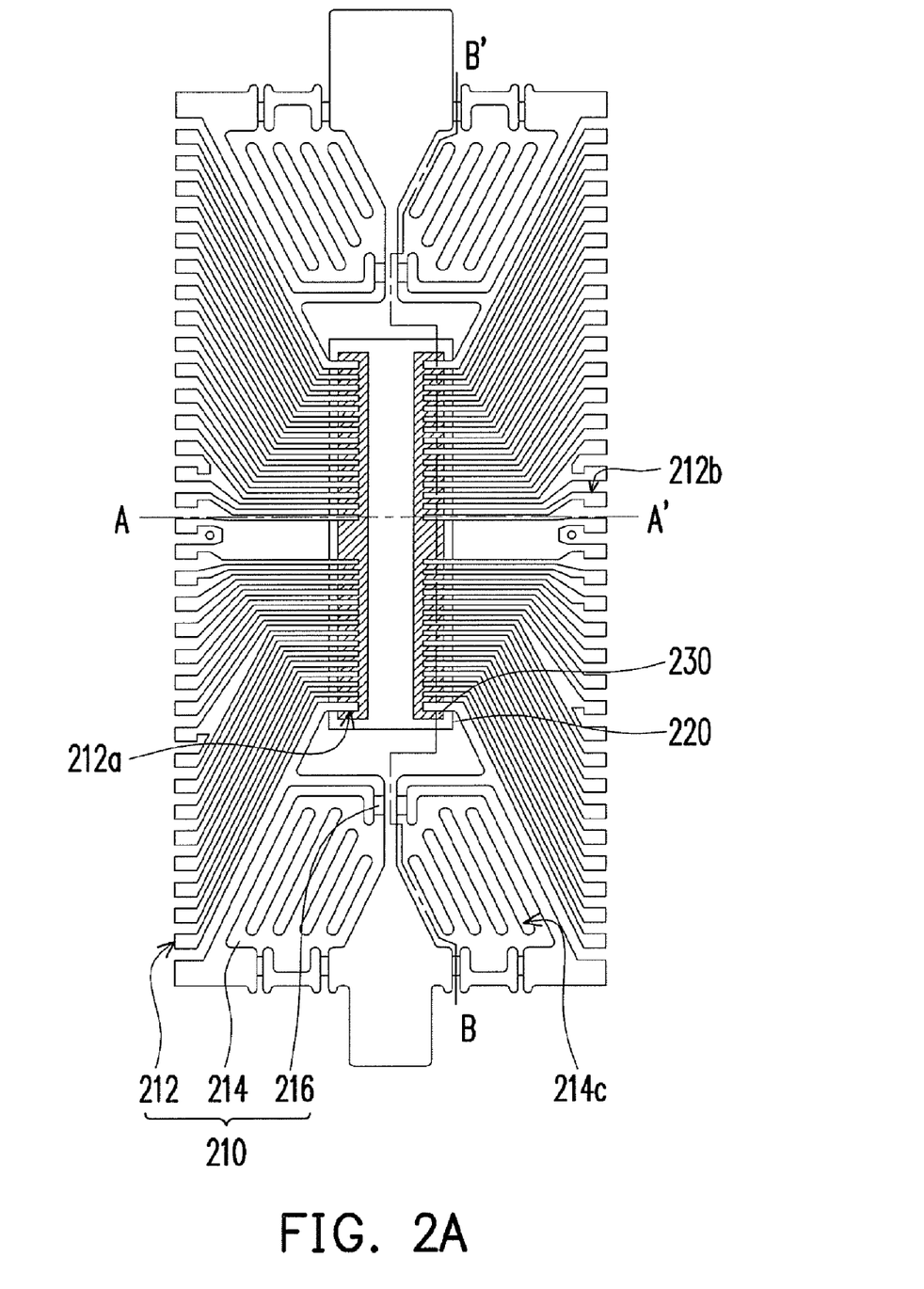
FIG. 2A is a schematic top view of a chip package before encapsulation according to the first embodiment of the present invention, wherein the first bonding wire and the encapsulant are not shown.
Figure 2B:
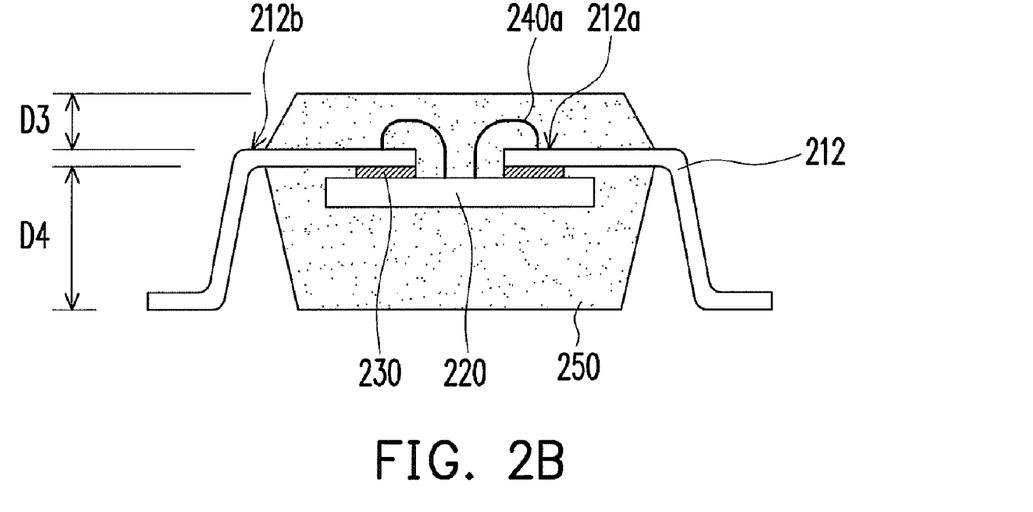
FIG. 2B is a schematic cross-sectional view along plane A-A' of the chip package after encapsulation in FIG. 2A.
Figure 2C:
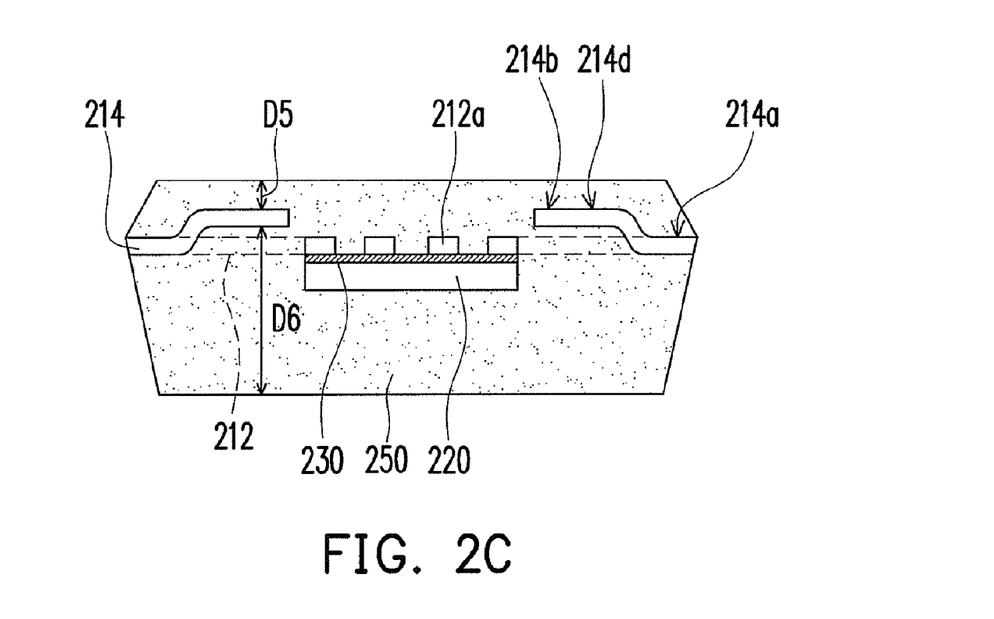
FIG. 2C is a schematic cross-sectional view along plane B-B' of the chip package after encapsulation in FIG. 2A.

FIG. 2A is a schematic top view of a chip package before encapsulation according to the first embodiment of the present invention, wherein the first bonding wire and the encapsulant are not shown. FIG. 2B is a schematic cross-sectional view along plane A-A' of the chip package after encapsulation in FIG. 2A, and FIG. 2C is a schematic cross-sectional view along plane B-B' of the chip package after encapsulation in FIG. 2A. Referring to FIGS. 2A and 2B, the chip package of the embodiment includes a lead frame 210, a chip 220, an adhesive layer 230, bonding wires 240a and an encapsulant 250, wherein the chip 220 is fixed under the lead frame 210, the adhesive layer 230 is disposed between the chip 220 and the lead frame 210 for fixing the chip 220. The material of the adhesive layer 230 can be polyimide or non-conductive glue. The first bonding wires 240a are electrically connected between the chip 220 and the lead frame 210 and the material of the first bonding wires 240a can be gold, aluminum or other conductive materials. The encapsulant 250 is used for encapsulating the partial lead frame 210, the chip 220, the adhesive layer 230 and the first bonding wires 240a and the material of the encapsulant 250 can be epoxy or other insulation materials.

Referring to FIGS. 2A and 2C, in more detail, the lead frame 210 includes a frame body 212 and at least a turbulent plate 214, wherein the material of the lead frame 210 can be iron, copper or other metal. Besides, the frame body 212 has inner lead portions 212a and outer lead portions 212b. The turbulent plate 214 has a first end 214a and a second end 214b, wherein the first end 214a is connected to the frame body 212.

Figure 2D:
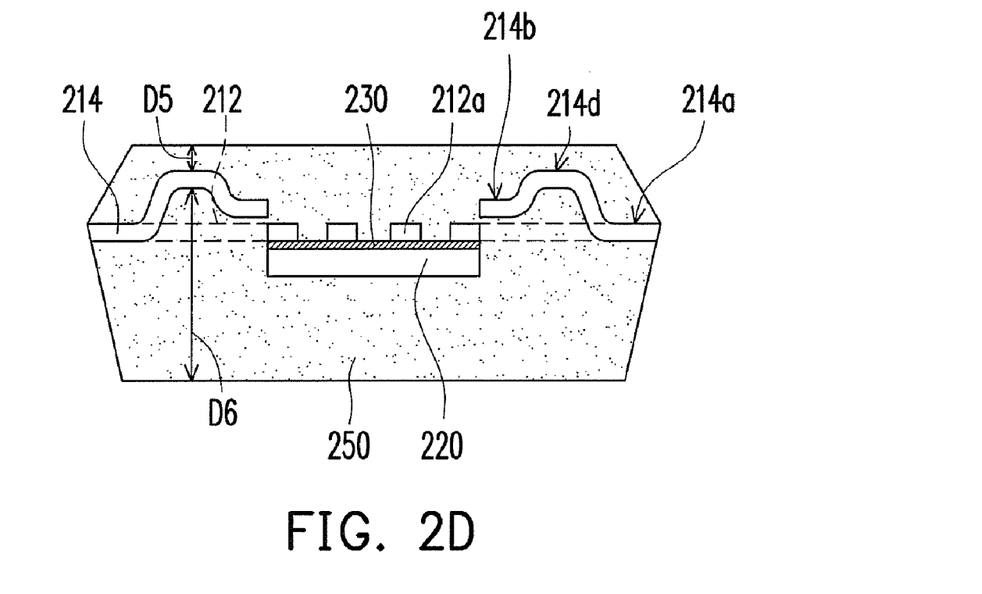
FIG. 2D is a schematic cross-sectional view of one exemplary chip package with asymmetric molding according to the present invention.

The turbulent plate 214 is bended upwards to form a bulge portion 214d. The second end 214b of the turbulent plate 214 is higher than the inner lead portions 212a. In addition, the second end 214b can be bended to be flat or in other angles. As shown in FIG. 2D, the turbulent plate 214 is bended upwards, then bended downwards to form the bulge portion 214d and the second end 214b of the turbulent plate 214 is higher than the inner lead portions.

The turbulent plate 214 of the lead frame 210 resides at both sides of the long-axis of the chip 220. However, the present invention doesn't limit the quantity of the turbulent plate 214 and the location thereof. In the embodiment, the lead frame 210 can further include a supporting bar 216 connected between the second end 214b of the turbulent plate 214 and the frame body 212. In other words, both ends of the turbulent plate 214 can be connected to the frame body 212. The supporting bar 216 can be alternatively connected between the frame body 212 and the side edge of the turbulent plate 214. Alternatively, the second end 214b of the turbulent plate 214 is not connected to the frame body 212. Similarly, the present invention doesn't limit the quantity of the supporting bar 216 and the location thereof. In addition, to improve mold flow, the turbulent plate 214 can have openings 214c.

Figure 2E:
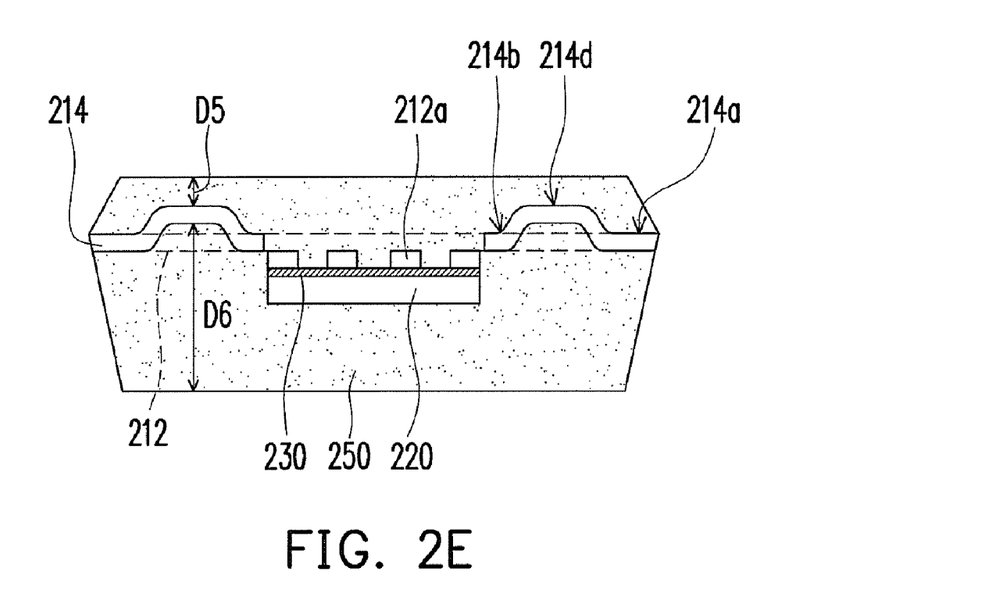
FIG. 2E is a schematic cross-sectional view of another exemplary chip package with down-set design according to the present invention.

In the embodiment, there is no height difference between the inner lead portions 212a and the frame body 212, while in another embodiment, the inner lead portions 212a can be designed as down-set (as shown in FIG. 2E). That is, the inner lead portions 212a can be disposed lower than the frame body 212. The adhesive layer 230 is disposed between the chip 220 and the inner lead portions 212a, while the first bonding wires 240a are electrically between the inner lead portions 212a and the chip 220.

Note that the thickness D3 of the encapsulant part 250 over the outer lead portions 212b and the thickness D4 of the encapsulant part 250 under the outer lead portions 212b are not equal. In other words, the chip package of the embodiment applies asymmetric molding. In addition, the thickness D6 of the encapsulant part 250 under the bulge portion 214d of the turbulent plate 214 and the thickness D5 of the encapsulant part 250 over the bulge portion 214d are not equal.

With a different material of the lead frame 210, the stress distribution and warpage of whole chip package produced as the encapsulant 250 condenses and shrinks are not identical. The design of the turbulent plate 214 could improve the stress distribution and warpage of whole chip package as the encapsulant 250 condenses and shrinks. Therefore, the present invention provides a chip package with higher reliability than the prior art. Besides, the present invention doesn't limit the applications to lead on chip package. In fact, the present invention can be applied to any chip packages having a die pad configuration, which is described in the following.

Figure 3A:
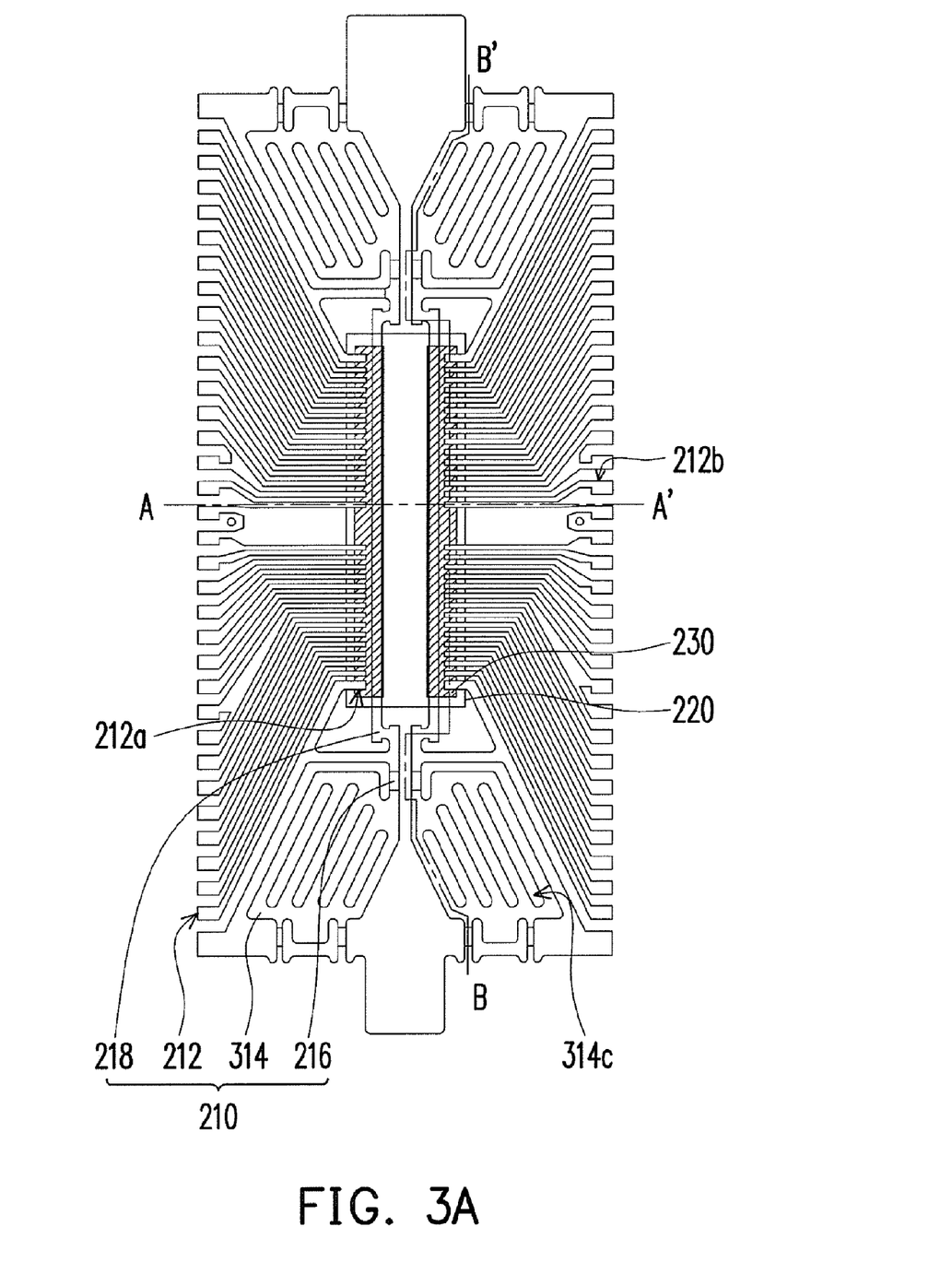
FIG. 3A is a schematic top view of a chip package before encapsulation according to the second embodiment of the present invention, wherein the first bonding wires, the second bonding wires and the encapsulant are not shown.
Figure 3B:
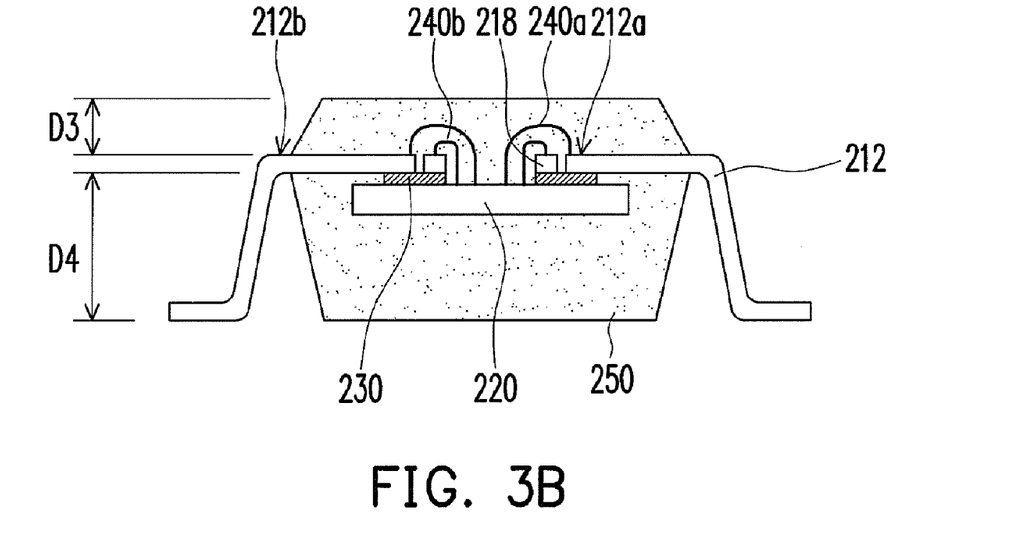
FIG. 3B is a schematic cross-sectional view along plane A-A' of the chip package after encapsulation in FIG. 3A.
Figure 3C:
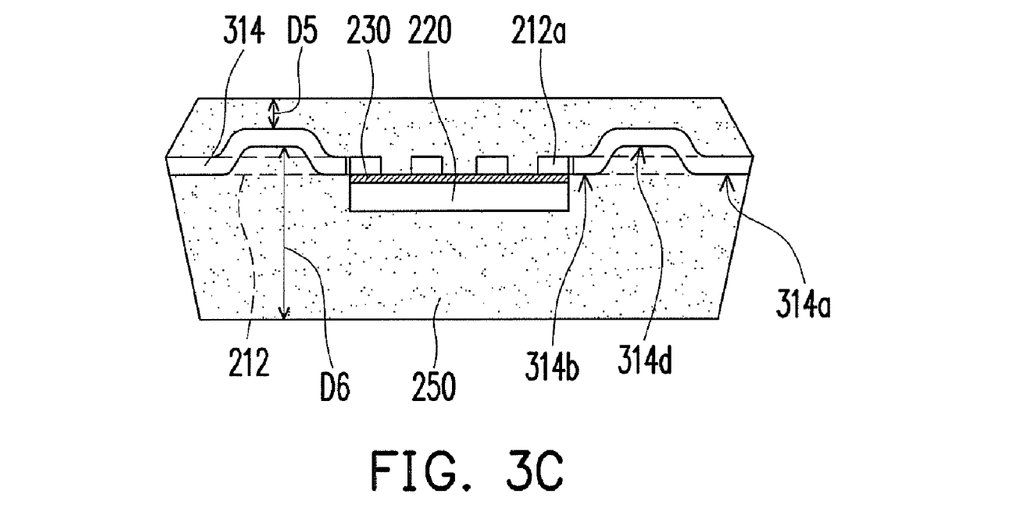
FIG. 3C is a schematic cross-sectional view along plane B-B' of the chip package after encapsulation in FIG. 3A.

FIG. 3A is a schematic top view of a chip package before encapsulation according to the second embodiment of the present invention, wherein the first bonding wires, the second bonding wires and the encapsulant are not shown. FIG. 3B is a schematic cross-sectional view along plane A-A' of the chip package after encapsulation in FIG. 3A and FIG. 3C is a schematic cross-sectional view along plane B-B' of the chip package after encapsulation in FIG. 3A. Referring to FIGS. 3A-3C, the embodiment is similar to the first embodiment. The difference of the embodiment is that the turbulent plate 314 has a first end 314a and a second end 314b and the first end 314a is connected to the frame body 212. The turbulent plate 314 is bended upwards to form a bulge portion 314d, then bended downwards. The second end 314b and the inner lead portions 212a are coplanar. However, the second end 314b can also be bended to be flat or in other angles. Like the first embodiment, the second end 314b of the turbulent plate 314 can also be connected to the frame body 212 (not shown) via the supporting bar 216; or, the second end 314b of the turbulent plate 314 can be a free end. The supporting bar 216 can also be connected between the side edge of the turbulent plate 314 and the frame body 212. The turbulent plate 314 can also have a plurality of openings 314c.

In the same way, the thickness D6 of the encapsulant part 250 under the bulge portion 314d of the turbulent plate 314 and the thickness D5 of the encapsulant part 250 over the bulge portion 314d of the turbulent 314 are not equal.

Referring to FIGS. 3A and 3B, the frame body 210 of the embodiment further includes bus bars 218, which are adjacent to the inner lead portions 212a. The chip package having an asymmetric molding of the embodiment further includes second bonding wires 240b connected between the chip 220 and the corresponding bus bars 218, respectively. In fact, the bus bars 218 of the embodiment can be applied to the first embodiment. Besides, in the embodiment, the second end 314b of the turbulent plate 314 and the inner lead portions 212a are not necessarily coplanar, which will be described hereinafter.

Figure 3D:
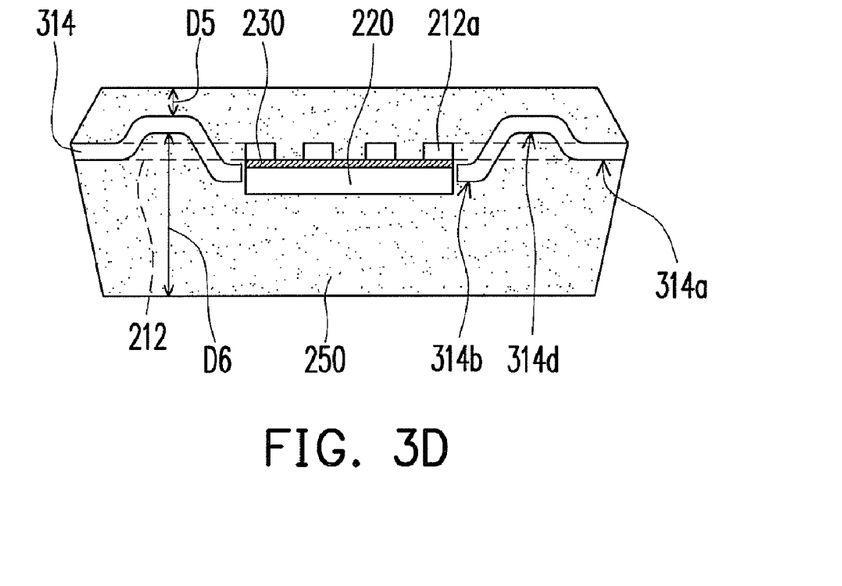
FIG. 3D is a schematic cross-sectional view of another chip package with asymmetric molding according to the first embodiment of the present invention.

FIG. 3D is a schematic cross-sectional view of another chip package with asymmetric molding according to the first embodiment of the present invention. Referring to FIG. 3D, the second end 314b of the turbulent plate 314 can also be bended to be lower than the inner lead portions 212a. However, the second end 314b can also be bended to be flat or in other angles. Similarly, the second end 314b of the turbulent plate 314 can be a free end; or, the second end 314b of the turbulent plate 314 can be connected to the frame body 212 via a supporting bar 216. The supporting bar 216 can also be connected between the turbulent plate 314 and the frame body 212.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chip package with asymmetric molding, comprising:
a lead frame, comprising:
a frame body, having a plurality of inner lead portions and a plurality of outer lead portions;
at least a turbulent plate, bended upwards to form a bulge portion, then bended downwards and having a first end and a second end, wherein the first end is connected to the frame body and the second end of the turbulent plate is higher than the inner lead portions;
a chip, fixed under the inner lead portions, wherein the turbulent plate is located at a side of the chip;
an adhesive layer, disposed between the chip and the inner lead portions;
a plurality of first bonding wires, electrically connected between the chip and the corresponding inner lead portions, respectively; and
an encapsulant, encapsulating at least the chip, the first bonding wires, the inner lead portions, the adhesive layer and the turbulent plate, wherein the thickness of the encapsulant part under the outer lead portions and the thickness of the encapsulant part over the outer lead portions are not equal.

2. The chip package with asymmetric molding as recited in claim 1, wherein the second end of the turbulent plate is bended to be flat.

3. The chip package with asymmetric molding as recited in claim 1, wherein the lead frame further comprises at least a supporting bar connected between the second end of the turbulent plate and the frame body.

4. The chip package with asymmetric molding as recited in claim 3, wherein the supporting bar is connected between the frame body and the side edge of the turbulent plate.

5. The chip package with asymmetric molding as recited in claim 1, wherein the inner lead portions are designed as down-set.

6. The chip package with asymmetric molding as recited in claim 1, wherein the lead frame further comprises a plurality of bus bars and the bus bars are adjacent to the inner lead portions.

7. The chip package with asymmetric molding as recited in claim 6, further comprising a plurality of second bonding wires electrically connected between the chip and the corresponding bus bars, respectively, wherein the encapsulant further encapsulates the second bonding wires and the bus bars.

8. The chip package with asymmetric molding as recited in claim 1, wherein the turbulent plate has a plurality of openings.

9. The chip package with asymmetric molding as recited in claim 1, wherein the thickness of the encapsulant part under the bulge portion of the turbulent plate and the thickness of the encapsulant part over the bulge portion of the turbulent plate are not equal.

\* \* \* \* \*